(12) United States Patent
Czimmek

(10) Patent No.: US 9,863,381 B2
(45) Date of Patent: Jan. 9, 2018

(54) FREQUENCY TO VOLTAGE CONVERTER USING GATE VOLTAGE SAMPLING OF POWER OSCILLATOR

(75) Inventor: Perry Robert Czimmek, Williamsburg, VA (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 1493 days.

(21) Appl. No.: 12/465,722

(22) Filed: May 14, 2009

(65) Prior Publication Data

US 2010/0288755 A1 Nov. 18, 2010

(51) Int. Cl.
| | |
|---|---|
| *H05B 6/06* | (2006.01) |
| *H03D 3/00* | (2006.01) |
| *F02M 53/06* | (2006.01) |
| *H03K 9/06* | (2006.01) |

(52) U.S. Cl.
CPC .............. *F02M 53/06* (2013.01); *H03K 9/06* (2013.01)

(58) Field of Classification Search
CPC .......... H03K 9/06; G01R 23/09; G01R 23/06; G01P 3/4805; F02M 53/06; H05B 6/06; H05B 6/04; H05B 6/08; H03D 3/00; H02M 7/523; G05D 23/26
USPC ......... 219/665, 660; 327/102, 100, 103–105, 327/139, 116, 120–123, 119, 118, 117, 327/115, 114, 113, 101; 363/164, 149, 363/100, 73, 74, 62, 56.11, 56.08, 35, 23, 363/25, 19, 21.01, 28, 51, 56.05, 59
See application file for complete search history.

(56) References Cited

U.S. PATENT DOCUMENTS

| | | | | |
|---|---|---|---|---|
| 3,594,588 A | * | 7/1971 | Evans et al. ..................... | 327/49 |
| 3,971,995 A | * | 7/1976 | Eikelberger .................. | 329/330 |
| 4,599,600 A | * | 7/1986 | McGuire .................. | H03K 5/26 327/12 |
| 4,628,272 A | * | 12/1986 | Davis ........................ | H03D 3/20 329/305 |
| 4,673,937 A | * | 6/1987 | Davis ............................. | 342/72 |
| 4,740,964 A | * | 4/1988 | Stalick ...................... | H04J 3/14 327/31 |
| 5,126,585 A | * | 6/1992 | Boys ....................... | H02J 9/062 307/45 |
| 5,331,127 A | * | 7/1994 | Chen ........................ | H05B 6/06 219/660 |
| 5,357,196 A | * | 10/1994 | Ito ................................. | 324/166 |
| 5,510,794 A | * | 4/1996 | Asbury et al. .................. | 342/42 |
| 5,585,716 A | * | 12/1996 | Gervais et al. ............... | 324/142 |

\* cited by examiner

*Primary Examiner* — Tu B Hoang
*Assistant Examiner* — Diallo I Duniver

(57) ABSTRACT

A frequency-to-voltage (F2V) conversion module includes a pulse shaping module that generates a square wave signal based on an oscillator signal, an edge to pulse conversion module that generates a pulse train based on corresponding rising and falling edges of the square wave signal, and an integrator module that generates an output voltage based on the pulse train. The output voltage is based on a frequency of the oscillator signal.

3 Claims, 3 Drawing Sheets

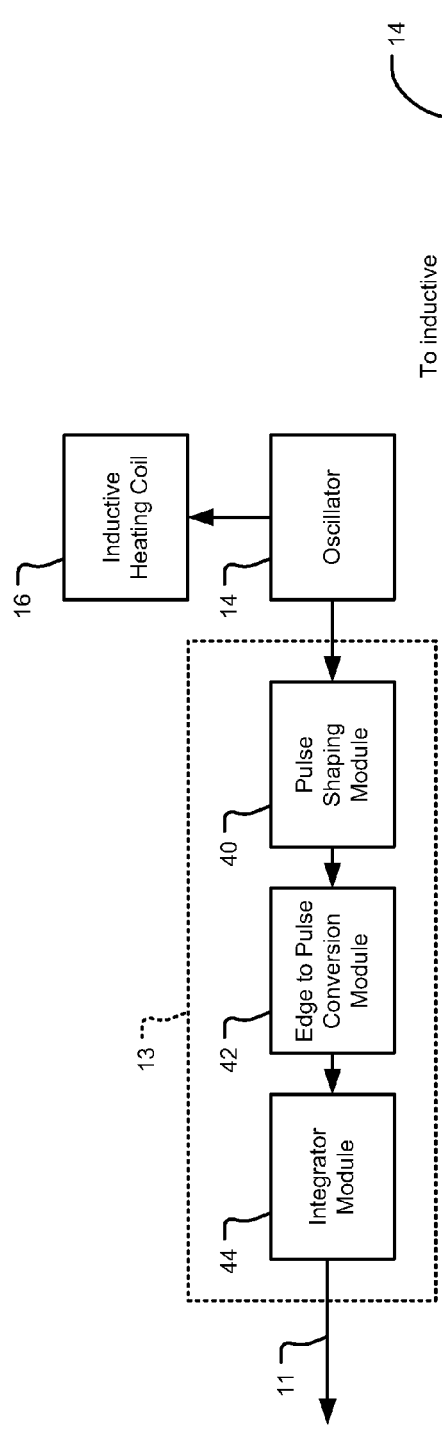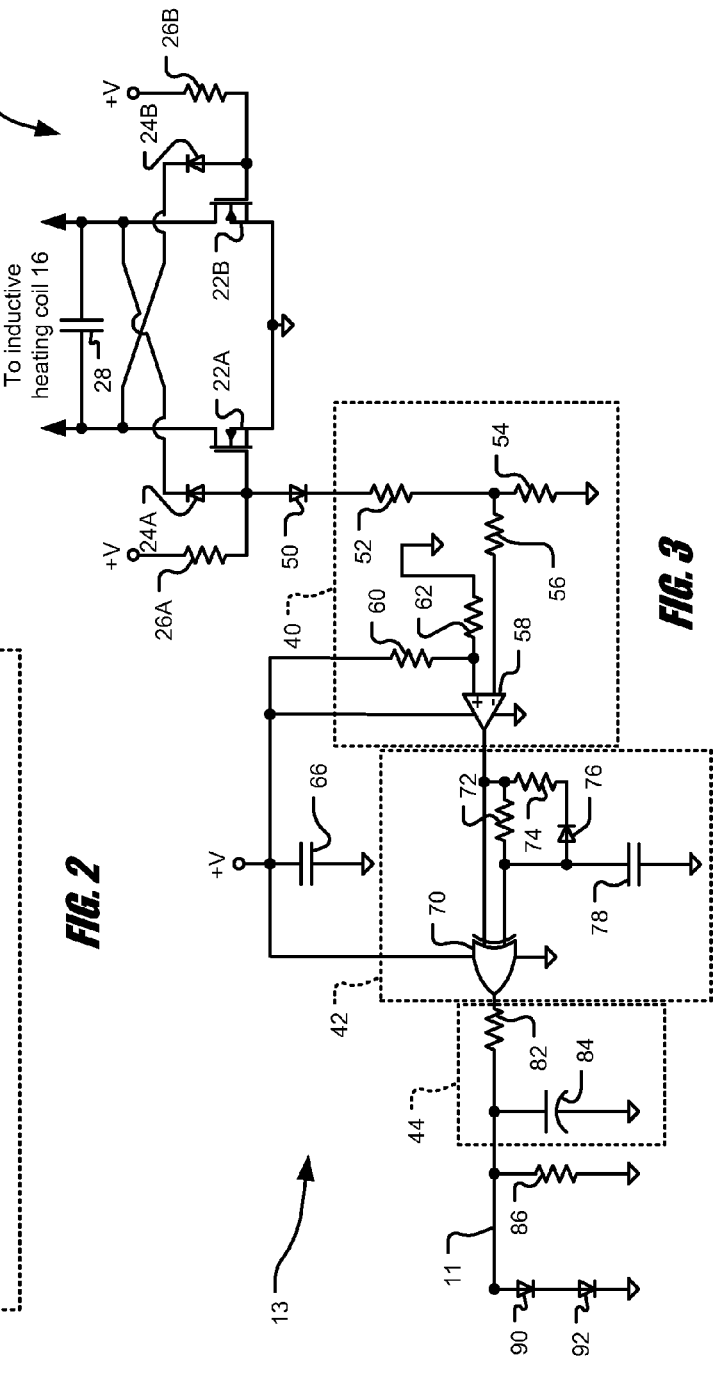
FIG. 2
FIG. 3

FREQUENCY TO VOLTAGE CONVERTER USING GATE VOLTAGE SAMPLING OF POWER OSCILLATOR

FIELD

The present disclosure relates to frequency to voltage conversion.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In some control systems it is desirable to measure the frequency of an oscillator. The oscillator may be employed to provide high-frequency energy to an inductive heater. An example of such an application may be found in engine control modules for fuel-injected internal combustion engines. In those applications the oscillator powers an inductive heater that is incorporated into the fuel injector. The inductive heater heats the fuel during predetermined conditions, such as cold starts, to improve fuel atomization from the injector. The improved fuel atomization helps to reduce hydrocarbon emissions and improves cold start performance, particularly when using fuel that includes ethanol. Ethanol becomes increasing difficult to atomize as it gets colder.

It is undesirable to measure the oscillator frequency by directly measuring its output current or voltage. The output current and/or voltage may be hundreds or thousands of times higher than other signals in the engine control circuitry. Directly measuring the current is additionally undesirable as it may introduce a loss component such as a sense resistor or the wire of a Hall sensor. These components also add cost to a measurement circuit.

Measuring the oscillator frequency can be a common-mode and measurement problem which can be solved with higher cost components. Typical devices for frequency-to-voltage conversion are either too expensive for automotive serial production, such as the Analog Devices AD650, or not readily available, or require somewhat complex additional circuitry such as a charge-pump or a PLL (Phase-Locked Loop) integrated circuit.

SUMMARY

A frequency-to-voltage (F2V) conversion module includes a pulse shaping module that generates a square wave signal based on an oscillator signal, an edge to pulse conversion module that generates a pulse train based on corresponding rising and falling edges of the square wave signal, and an integrator module that generates an output voltage based on the pulse train. The output voltage is based on a frequency of the oscillator signal.

In some aspects the pulse shaping module comprises a comparator. The F2V conversion module includes a digital to analog conversion module that generates a reference voltage for the comparator. The edge to pulse conversion module comprises an exclusive OR (X-OR) gate. The pulse train is coupled to one input of the X-OR gate and a delayed version of the pulse train is coupled to a second input of the X-OR gate. The F2V conversion module includes a filter that provides the delayed version of the pulse train. The integrator module comprises a capacitor that charges through a resistor.

A method of controlling an inductive fuel heater is disclosed. The method includes generating a square wave signal based on an oscillator signal that controls an inductive fuel heater, generating a pulse train based on corresponding rising and falling edges of the square wave signal, and generating an output voltage based on the pulse train. The output voltage is based on a frequency of the oscillator signal and controlling a temperature of the inductive fuel heater is based on the output voltage.

In some aspects generating the square wave signal comprises comparing the oscillator signal to a reference signal. The method includes generating the reference voltage based on a digital signal. Generating the pulse train comprises an exclusive OR of the pulse train and a delayed version of the pulse train. The method includes filtering the pulse train to provide the delayed version of the pulse train. Generating the output voltage comprises integrating the pulse train.

A frequency-to-voltage (F2V) conversion module includes pulse shaping means for generating a square wave signal based on an oscillator signal, edge to pulse conversion means for generating a pulse train based on corresponding rising and falling edges of the square wave signal, and integrator means for generating an output voltage based on the pulse train. The output voltage is based on a frequency of the oscillator signal.

In some aspects the pulse shaping means comprises comparator means for comparing a reference voltage and the oscillator signal. The F2V conversion module includes digital to analog conversion means for generating a reference voltage for the comparator. The edge to pulse conversion means comprises exclusive OR (X-OR) means for that exclusive Ors the pulse train and a second signal. The second signal is a delayed version of the pulse train. The F2V conversion module includes filter means for generating the delayed version of the pulse train. The integrator means includes a capacitor that charges through a resistor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a functional block diagram of a frequency-to-voltage (F2V) conversion module and associated oscillator with load;

FIG. 3 is a schematic diagram of a first embodiment of an F2V conversion module.

DETAILED DESCRIPTION

Figure 1:
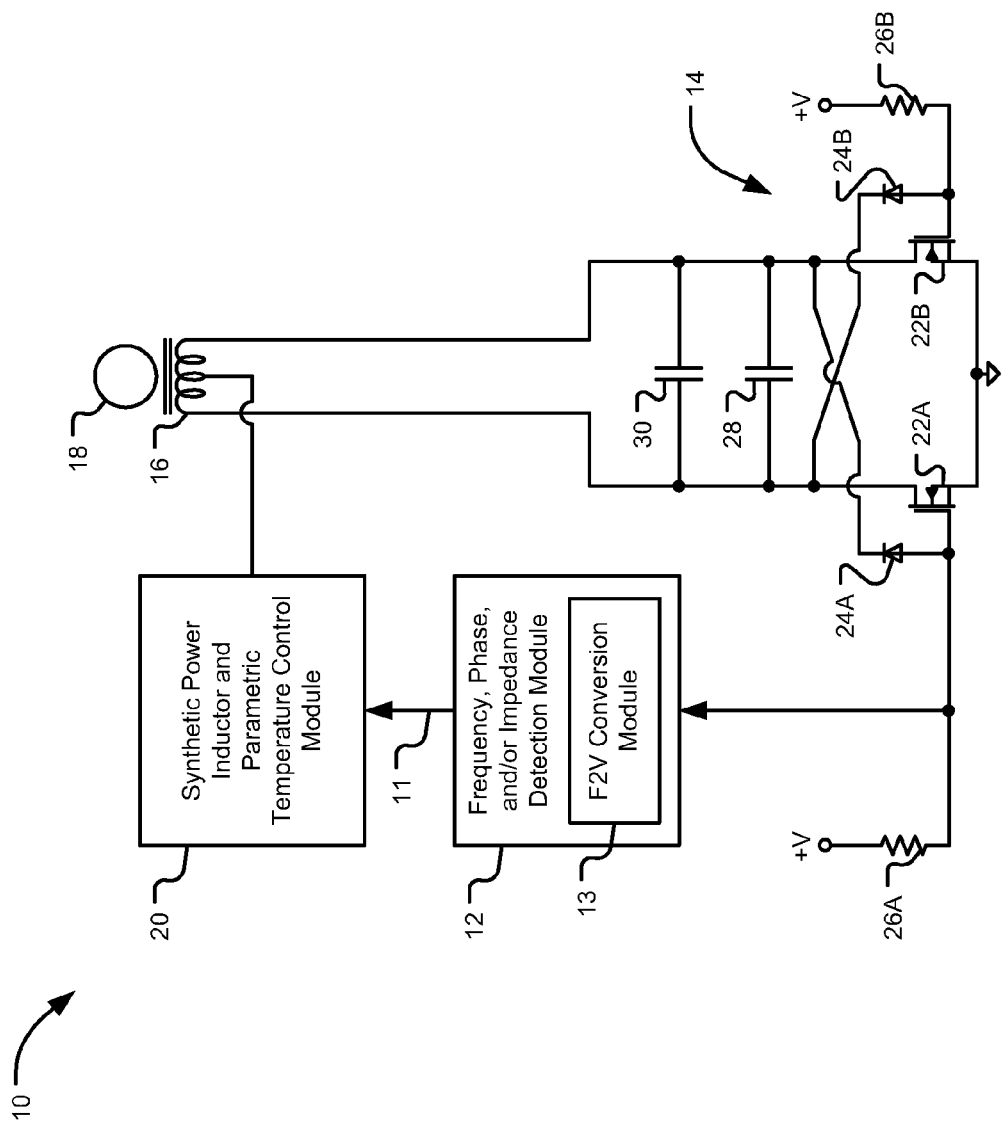
FIG. 1 is a functional block diagram of a fuel injector heating system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 1, a functional block diagram is shown of a fuel injector heating system 10. Fuel injector heating system 10 includes a frequency, phase, and/or impedance detection module 12. Detection module 12 senses at least one of frequency, phase, and impedance of power that is flowing to an inductive heating coil 16. Detection module 12 generates respective signal(s) 11 based on the at least one of frequency, phase, and impedance.

In the depicted embodiment, detection module 12 senses frequency and therefore includes a frequency-to-voltage (F2V) conversion module 13. F2V conversion module 13, which is described below in more detail, eliminates the problem of directly measuring the output voltage or current of an oscillator 14. F2V conversion module 13 also provides a simple, cost-efficient approach for frequency to voltage conversion.

Oscillator 14 provides high-frequency energy to inductive heating coil 16. Inductive heating coil 16 heats fuel that flows through a fuel injector 18. Fuel injector 18 is typically mounted in an internal combustion engine (not shown).

A synthetic power inductor and parametric temperature control module 20, hereinafter referred to as control module 20, senses and/or estimates the temperature of inductive heating coil 16. Control module 20 also selectively provides power +V to oscillator 14 to control the heat from inductive heating coil 16. In some applications power +V is 5V, however it should be appreciated by those skilled in the art that other voltages may be employed based on specifications of the circuit components.

Oscillator 14 includes first transistor 22A and second transistor 22B, collectively referred to as transistors 22. Transistors 22 can be bipolar junction transistors, field effect transistors, insulated gate bipolar transistors, and the like. The sources of transistors 22 communicate with ground. The drain of transistor 22A communicates with a cathode of a diode 24B. The drain of transistor 22B communicates with a cathode of a diode 24A. Diodes 24A and 24B are collectively referred to as diodes 24. The anode of each diode 24 communicates with the gate of its associated transistor 24. Power +V communicates with the gates of transistors 22 through respective resistors 26A and 26B, collectively referred to as resistors 26. The drains of transistors 22 are connected to respective ends of a parallel resonant tank circuit that comprises inductive heating coil 16 and one or more capacitors 28, 30.

Referring now to FIG. 2, a functional block diagram is shown of F2V conversion module 13. F2V conversion module 13 includes a pulse shaping module 40 and an edge to pulse conversion module 42. Pulse shaping module 40 receives a gate signal from oscillator module 14. The gate signal is taken from the gate of one of transistors 22 (best shown in FIG. 3). Pulse shaping module 40 generates square wave pulses based on the gate signal. The square wave pulses have the same frequency as the gate signal, but faster rise and fall times.

Edge to pulse conversion module 42 generates a pulse with each rising and falling edge that it receives from pulse shaping module 40. An integrator module 44 generates output signal 11 based on integration or averaging of the square wave pulses. The voltage of output signal 11 represents the frequency of oscillator module 14.

Referring now to FIG. 3, a schematic diagram is shown of one embodiment of F2V conversion module 13. The gate signal of transistor 22A is sampled through a diode 50. Diode 50 prevents F2V conversion module 13 from unintentionally charging the gate of transistor 22A and thereby turning it 'ON' in an uncontrolled manner.

In typical implementations of transistors 22, the gate voltage is usually much less than the drain voltage of a MOSFET or IGBT. In the case of a BJT implementation of transistor 22, the base voltage is less than the collector voltage, for an NPN-type. Sampling the gate voltage is therefore advantageous when compared to sampling other higher voltages in oscillator 14.

The gate voltage is divided by a first resistance divider which is formed by resistors 52, 54 and referenced to ground. An output of the first resistance divider communicates through a resistor 56 to an inverting input of a comparator 58. Power +V provides power to comparator 58. A decoupling capacitor 66 connects across power +V and ground.

A non-inverting input of comparator 58 receives a reference voltage which is based on power +V. The reference voltage is generated by a second resistance divider that is formed by resistors 60, 62. The second resistance divider receives power +V and is referenced to ground. The reference voltage is taken at an output of the second resistance divider.

An output voltage of comparator 58 goes 'HI' or 'LO' depending on a comparison of the reference voltage to the divided gate voltage from resistor 56. The outcome of the comparison, and hence the output voltage of comparator 58, will alternate with the same frequency as the frequency of oscillator 14.

The output signal from comparator 58 communicates with the input of edge to pulse conversion module 42. Edge to pulse conversion module 44 includes a two input exclusive-OR gate 70. A first one of the inputs receives the output signal from comparator 58. A second one of the inputs receives a delayed version of the output signal from comparator 58.

The delayed version of the output signal is provided by a filter. The filter is formed by a resistor 72, a capacitor 78, a diode 76, and a resistor 74. Resistor 72 conducts charge to capacitor 78 when the output voltage from comparator 58 is high. Capacitor 78 discharges through diode 76 and resistors 72, 74 when the output voltage from comparator 58 goes low. It should be appreciated by those skilled in the art that other combinations of diodes and resistors can be used to delay the signal to one of the inputs input of exclusive-OR gate 70, thereby setting the output pulse widths. In some embodiments the components are selected to ensure discharge and charge time is approximately the same The delay time of the on and off states between the inputs of X-OR gate 70 determines a pulse width of pulses that appear at the output of X-OR gate 70. If the voltage that supplies X-OR gate 70 and comparator 58 is constant, then the pulse widths out of X-OR gate 70 are always the same duration and amplitude. Furthermore, the frequency of pulses coming out of X-OR gate 70 is twice the frequency of oscillator 14 since there is one pulse for each rising and falling edge coming from comparator 58. These pulses, having the same width and voltage, act as packets of charge that feed integrator module 44.

In the depicted embodiment, integrator module 44 comprises a simple resistor-capacitor filter that is formed by resistor 82 and capacitor 84. The voltage of the integrator, which is taken at the junction of resistor 82 and capacitor 84, is proportional to the rate of pulses from X-OR gate 70. The integrator voltage therefore reflects oscillator 14 frequency since the pulse rate is proportional to oscillator 14 frequency. This proportional relationship can be considered linear for control purposes provided the maximum voltage out is less than the voltage achieved in one RC time constant, e.g. 63% of power +V. Shorter time constants improve linearity. The linear relationship is such that a doubling of frequency doubles the voltage of the integrator. A resistor 86 discharges capacitor 84 at a predetermined rate to prevent saturating integrator module 44.

The transfer function between the frequency of oscillator 14 and the voltage of output signal 11 can be provided by $$\frac{V_L}{R} t = Q_P, \quad \text{Eq. 1}$$

$$V = \frac{Q_P}{C}, \text{ and} \quad \text{Eq. 2}$$

$$V = 2f \frac{\left(\frac{V_L}{R}\right)t}{C}, \text{ where} \quad \text{Eq. 3}$$

$V_L$ is the voltage of power +V, R is the resistance of resistor 82, $Q_P$ is charge on capacitor 84 in Coulombs, C is the capacitance of capacitor 84, t is pulse width time, in seconds, out of X-OR gate 70, f is the frequency of the gate signal that is applied to F2V converter module 13, and V is the voltage of output signal 11.

The voltage of output signal 11 may be clamped to protect downstream circuitry (not shown). One of several embodiments of a clamp is shown. Diodes 90, 92 clamp the output voltage to two diode drops. It should be appreciated by those skilled in the art that other voltage clamp arrangements may also be employed.

Figure 4:
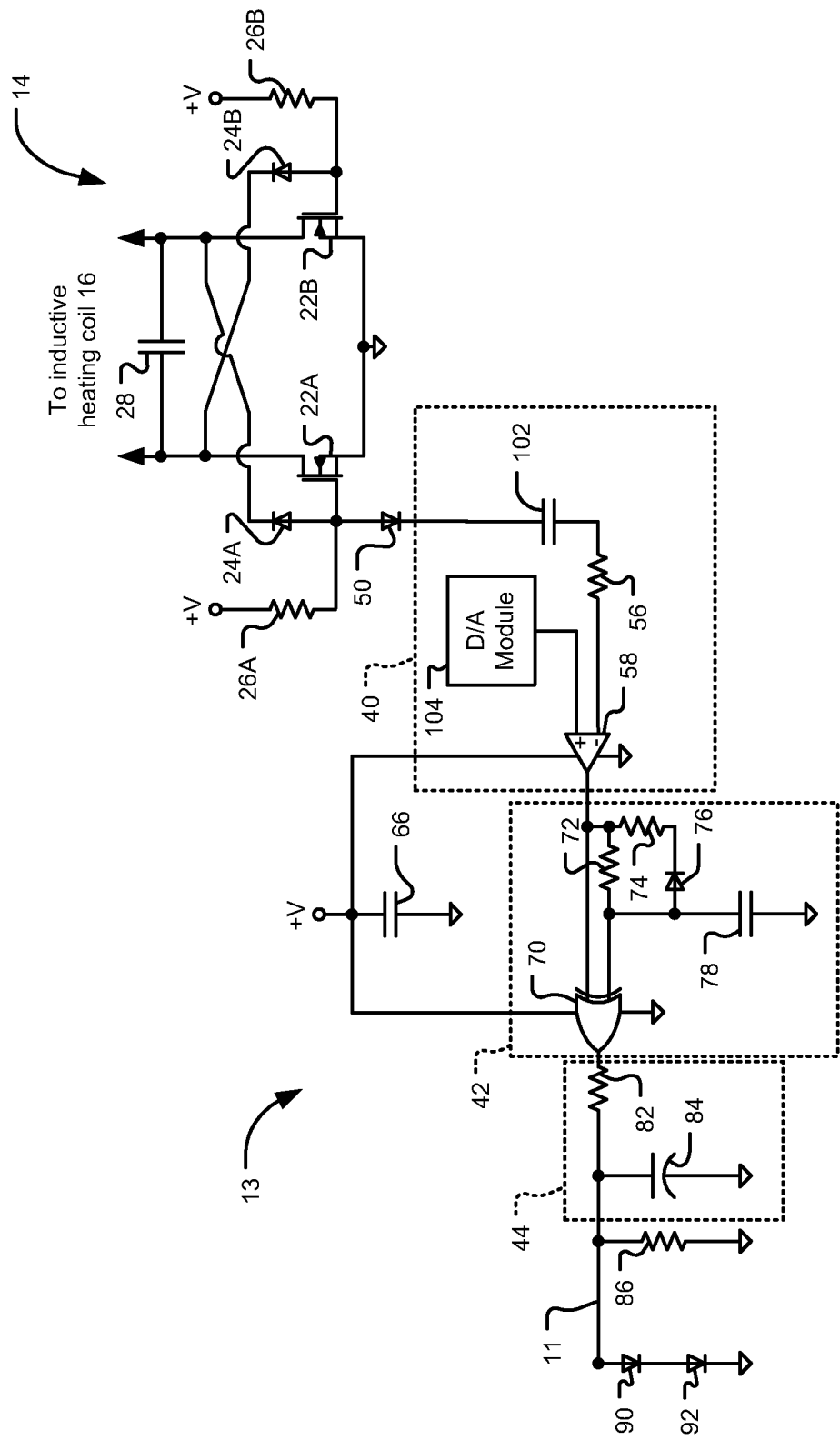
FIG. 4 is a schematic diagram of a second embodiment of an F2V conversion module.

Referring now to FIG. 4, alternate embodiments are shown for various elements of F2V converter module 13. In a first alternate embodiment a capacitor 102 closes the signal path from the gate of transistor 22A to one of the inputs of comparator 58. Capacitor 102 replaces the first voltage divider that comprised resistors 52, 54 (shown in FIG. 3).

In a second alternate embodiment a digital-to-analog (D/A) module 104 provides the reference voltage to comparator 58. D/A module 104 generates the reference voltage based on a digital value that it receives from a processor (not shown).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A frequency-to-voltage conversion module for an inductive heating coil, the module comprising:
a pulse shaping module configured to receive a transistor gate signal from an oscillator module in communication with the inductive heating coil and generate a square wave signal based on the received transistor gate signal, the pulse shaping module including a circuit having a comparator and a square wave output node in communication with the comparator and configured to output a square wave signal having a pulse-frequency being the same as a gate-signal-frequency of the transistor gate signal, where rising and falling edges of the square wave signal are faster than rising and falling edges of the transistor gate signal;
an edge to pulse conversion module configured to generate a pulse train based on corresponding rising and falling edges of the square wave signal, the edge to pulse conversion module including an exclusive OR gate (X-OR) and a delay circuit, the exclusive OR gate having a first input coupled to the square wave output node and a second input coupled to the square wave output node via the delay circuit, the delay circuit comprising a first resistor, a first capacitor, a diode, and a second resistor, the first resistor coupled to the pulse shaping module and configured to conduct charges to the first capacitor when an output voltage from the pulse shaping module is high, the first capacitor discharging through the diode and the first and second resistors when the output voltage from the pulse shaping module is low, a frequency of pulses of the pulse train is twice the frequency of the transistor gate signal; and
an integrator module configured to receive the pulse train at an integrator module input, the integrator module comprising a resistor-capacitor filter, the resistor-capacitor filter comprising a third resistor and a second capacitor, the integrator module having an output voltage measured at a junction of the third resistor and the second capacitor and being proportional to a rate of pulses outputted from the exclusive OR gate.

2. The frequency-to-voltage conversion module of claim 1 further comprising a digital to analog conversion module that generates a reference voltage for the comparator.

3. The frequency-to-voltage conversion module of claim 1 wherein the integrator module comprises a third capacitor that charges through a fourth resistor.

* * * * *